United States Patent
Kim

(10) Patent No.: US 8,278,759 B2
(45) Date of Patent: Oct. 2, 2012

(54) STRUCTURES FOR MEASURING MISALIGNMENT OF PATTERNS

(75) Inventor: Wan-Seob Kim, Gunpo-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 277 days.

(21) Appl. No.: 12/656,552

(22) Filed: Feb. 3, 2010

(65) Prior Publication Data
US 2010/0193786 A1    Aug. 5, 2010

(30) Foreign Application Priority Data
Feb. 5, 2009    (KR) .................. 10-2009-0009126

(51) Int. Cl.
*H01L 23/48* (2006.01)
*H01L 23/52* (2006.01)
(52) U.S. Cl. . 257/758; 257/767; 257/773; 257/E23.011; 257/E23.015
(58) Field of Classification Search .............. 257/758, 257/767, 773, E23.011, E23.015
See application file for complete search history.

(56) References Cited

U.S. PATENT DOCUMENTS
6,459,151 B1    10/2002 Chung et al.
2005/0024930 A1*    2/2005 Yoda et al. .................. 365/158
2006/0009025 A1*    1/2006 Kanamura .................. 438/618

FOREIGN PATENT DOCUMENTS
KR    10-0234367    9/1999
KR    10-0575619    4/2006
* cited by examiner

*Primary Examiner* — Ngan Ngo
(74) *Attorney, Agent, or Firm* — Harness, Dickey & Pierce, P.L.C.

(57) ABSTRACT

A structure for measuring misalignment of patterns may include a first wiring and a second wiring. The first wiring may include a first lower pattern and a first upper pattern. The first upper pattern may extend in a y-direction, and a first end portion of the first upper pattern that is relatively further toward (proximal to) a negative y-direction may contact the first lower pattern. The second wiring may include a second lower pattern and a second upper pattern. The second upper pattern may extend in the y-direction, a second end portion of the second upper pattern that is relatively further toward (proximal to) a positive y-direction may contact the second lower pattern. The second wiring may be spaced apart from the first wiring along the negative y-direction.

8 Claims, 4 Drawing Sheets

STRUCTURES FOR MEASURING MISALIGNMENT OF PATTERNS

CROSS-REFERENCE TO RELATED APPLICATION

This application claims priority under 35 USC §119 to Korean Patent Application No. 10-2009-0009126, filed on Feb. 5, 2009 with the Korean Intellectual Property Office (KIPO), the entire contents of which are herein incorporated by reference.

BACKGROUND

1. Field

Example embodiments relate to structures for measuring misalignment of patterns and methods of measuring misalignment of patterns using the same. Example embodiments also relate to structures for measuring misalignment of conductive patterns in a semiconductor device and methods of measuring misalignment of conductive patterns in a semiconductor device using the same.

2. Description of the Related Art

After performing processes for forming semiconductor devices on a wafer, misalignment of patterns of the semiconductor devices may be measured. However, the wafer may be damaged during the misalignment measurement. As a result, the measurement may be performed on a monitor substrate or a test substrate (as opposed to the actual wafer). Processes substantially the same as those performed on the actual wafer may be performed on the test substrate, and misalignment of patterns, (e.g., test element group (TEG)) on the test substrate may be measured. Misalignment of patterns in a semiconductor device manufacture process may increase a design rule of semiconductor devices. As a result, the chip size including the semiconductor devices may increase, and the stability of the process may be deteriorated.

Light or resistance may be used for measuring misalignment of patterns. When light is used for measuring misalignment of patterns, a reflective light from the patterns may be detected, and the detected reflective light may be transformed into an electrical signal by a photodiode or a charge coupled device (CCD). However, the real misalignment may be different from the calculated misalignment by the electrical signal.

When the resistance is used for measuring misalignment of patterns, a current may be applied to the patterns, and a change of resistance may be detected. The resistance may be detected by a current flowing through upper and lower patterns, which are connected to each other at a specific contact area. When the contact area becomes smaller from misalignment, the resistance may increase (and vice versa). However, the patterns may be electrically connected to each other. As a result, even if the upper and lower patterns are misaligned in a specific direction (such that some contact areas become smaller while other contact areas become larger), a change in resistance may still not occur. Thus, the misalignment may not be detected.

SUMMARY

Example embodiments relate to structures for measuring misalignment of conductive patterns. Example embodiments also relate to methods of measuring misalignment of conductive patterns.

A structure for measuring misalignment of patterns may include a first wiring and a second wiring. The first wiring may include a first lower pattern and a first upper pattern. The first upper pattern may extend in a y-direction, and a first end portion of the first upper pattern that is proximal to a negative y-direction may contact the first lower pattern. The second wiring may include a second lower pattern and a second upper pattern. The second upper pattern may extend in the y-direction, a second end portion of the second upper pattern that is proximal to a positive y-direction may contact the second lower pattern, and the second wiring may be spaced apart from the first wiring along the negative y-direction.

The first wiring may have a first resistance which changes according to a first misalignment between the first upper pattern and the first lower pattern in the y-direction. The second wiring may have a second resistance which changes according to a second misalignment between the second upper pattern and the second lower pattern in the y-direction. The first resistance may increase (so as to be relatively high) when the second resistance decreases (so as to be relatively low).

Another structure for measuring misalignment of patterns may include a first wiring and a second wiring. The first wiring may include a first lower pattern and a first upper pattern. The first upper pattern may extend in a y-direction and contact the first lower pattern. The second wiring may include a second lower pattern and a second upper pattern. The second upper pattern may extend in the y-direction and contact the second lower pattern. The second wiring may be spaced apart from the first wiring along a negative y-direction. The first wiring may be disposed between two first parallel lines, each of which extends in an x-direction perpendicular to the y-direction and has a first tab thereon. Similarly, the second wiring may be disposed between two second parallel lines, each of which extends in the x-direction and has a second tab thereon. A first end portion of the first upper pattern that is proximal to a positive y-direction may overlap the first tab, and a second end portion of the second upper pattern that is proximal to the negative y-direction may overlap the second tab.

The first lower pattern may include a first self-aligned contact (SAC) plug and the first upper pattern may include a first capacitor contact plug. The second lower pattern may include a second SAC plug, and the second upper pattern may include a second capacitor contact plug. The first and second parallel lines may include bit lines, and the first and second tabs may include bit line tabs.

The first wiring may have a first resistance which changes according to a first misalignment between the first upper pattern and the first lower pattern in the y-direction. The second wiring may have a second resistance which changes according to a second misalignment between the second upper pattern and the second lower pattern in the y-direction. The first resistance may increase (so as to be relatively high) when the second resistance decreases (so as to be relatively low).

Another structure for measuring misalignment of patterns may include a first wiring and a second wiring. The first wiring may include a first lower pattern and a first upper pattern. The first lower pattern may extend in a y-direction, and a first end portion of the first lower pattern that is proximal to a positive y-direction may contact the first upper pattern. The second wiring may include a second lower pattern and a second upper pattern. The second lower pattern may extend in the y-direction, a second end portion of the second lower pattern that is proximal to a negative y-direction may contact the second upper pattern, and the second wiring may be spaced apart from the first wiring along the negative y-direction.

The first lower pattern may include a first capacitor contact plug, and the first upper pattern may include a first storage node electrode of a first capacitor. The second lower pattern may include a second capacitor contact plug, and the second upper pattern may include a second storage node electrode of a second capacitor. The structure may further include a first SAC plug electrically connected to the first capacitor contact plug and a second SAC plug electrically connected to the second capacitor contact plug.

A method of measuring misalignment of patterns may include measuring a first resistance of a first wiring including a first lower pattern and a first upper pattern. The first upper pattern may extend in a y-direction, and a first end portion of the first upper pattern that is proximal to a negative y-direction may contact the first lower pattern. A second resistance of a second wiring including a second lower pattern and a second upper pattern may be measured. The second upper pattern may extend in the y-direction, a second end portion of the second upper pattern that is proximal to a positive y-direction may contact the second lower pattern, and the second wiring may be spaced apart from the first wiring along the negative y-direction. The misalignment of patterns may be determined or decided based on a difference between the first and second resistances.

The first and second wirings may be formed on a substrate in a scribe lane region. The substrate may include a cell region and the scribe lane region. When the first resistance is measured, a first voltage may be applied to the first wiring, and a first current through the first wiring may be measured. When the second resistance is measured, a second voltage may be applied to the second wiring, and a second current through the second wiring may be measured.

Another method of measuring misalignment of patterns may include measuring a first resistance of a first wiring including a first lower pattern and a first upper pattern. The first upper pattern may extend in a y-direction and contact the first lower pattern. The first wiring may be disposed between two first parallel lines, each of which extending in an x-direction perpendicular to the y-direction and having a first tab thereon. A first end portion of the first upper pattern that is proximal to a positive y-direction may overlap the first tab. A second resistance of a second wiring including a second lower pattern and a second upper pattern may be measured. The second upper pattern may extend in the y-direction and contact the second lower pattern. The second wiring may be spaced apart from the first wiring along a negative y-direction. The second wiring may be disposed between two second parallel lines, each of which extending in the x-direction and having a second tab thereon. A second end portion of the second upper pattern that is proximal to a negative y-direction may overlap the second tab. The misalignment of patterns may be determined or decided based on a difference between the first and second resistances.

The first and second lower patterns may include SAC plugs of a semiconductor device, and the first and second upper patterns may include capacitor contact plugs. The first and second parallel lines may include bit lines, and the first and second tabs may include bit line tabs. When the first resistance is measured, a first voltage may be applied to the first wiring and a first current through the first wiring may be measured. When the second resistance is measured, a second voltage may be applied to the second wiring and a second current through the second wiring may be measured.

Another method of measuring misalignment of patterns may include measuring a first resistance of a first wiring including a first lower pattern and a first upper pattern. The first lower pattern may extend in a y-direction, and a first end portion of the first lower pattern that is proximal to a positive y-direction may contact the first upper pattern. A second resistance of a second wiring including a second lower pattern and a second upper pattern may be measured. The second lower pattern may extend in the y-direction, a second end portion of the second lower pattern that is proximal to a negative y-direction may contact the second upper pattern, and the second wiring may be spaced apart from the first wiring along the negative y-direction. The first and second lower patterns may include capacitor contact plugs, and the first and second upper patterns may include storage node electrodes of a capacitor.

According to example embodiments, a structure for measuring misalignment of patterns may include at least two wirings, which are electrically insulated from each other and include upper and lower patterns. As a result, a misalignment between the upper and lower patterns along a specific direction may be measured with relative accuracy.

BRIEF DESCRIPTION OF THE DRAWINGS

Example embodiments may be more readily understood when the following detailed description is taken in conjunction with the accompanying drawings.

FIG. 1 is a top view illustrating a structure for measuring misalignment of patterns in accordance with example embodiments;

FIG. 2 is a top view illustrating the structure of FIG. 1 in a misaligned state in a y-direction;

FIG. 3 is a flowchart illustrating a method of measuring misalignment of patterns using the structure in FIG. 1 in with example embodiments;

FIG. 4 is a top view illustrating another structure for measuring misalignment of patterns in accordance with example embodiments;

FIG. 5 is a top view illustrating the structure of FIG. 4 in a misaligned state along a y-direction; and FIG. 6 is a top view illustrating another structure for measuring misalignment of patterns in accordance with example embodiments; and FIG. 7 is a top view illustrating the structure of FIG. 6 in a misaligned state in a y-direction.

DETAILED DESCRIPTION

Figure 1:
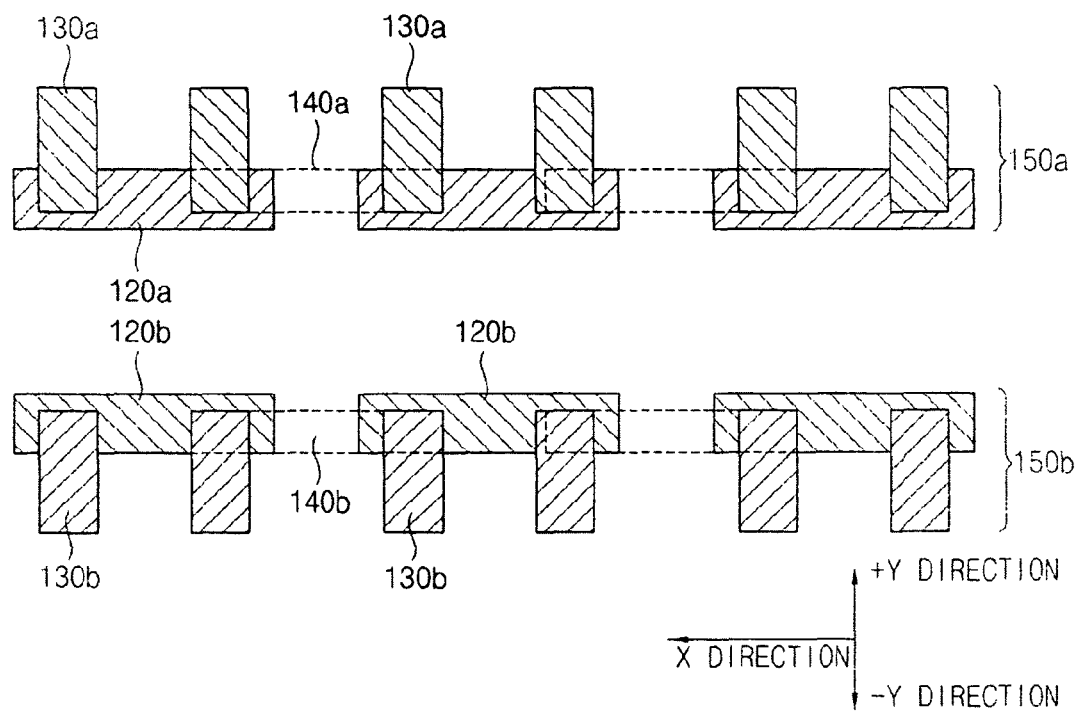
FIGS. 1 to 7 represent non-limiting, example embodiments as described herein.

Example embodiments will be described more fully hereinafter with reference to the accompanying drawings. However, it should be understood that the present inventive concepts may be embodied in many different forms and should not be construed as limited to example embodiments set forth herein. In the drawings, the sizes and relative dimensions of layers and regions may have been exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
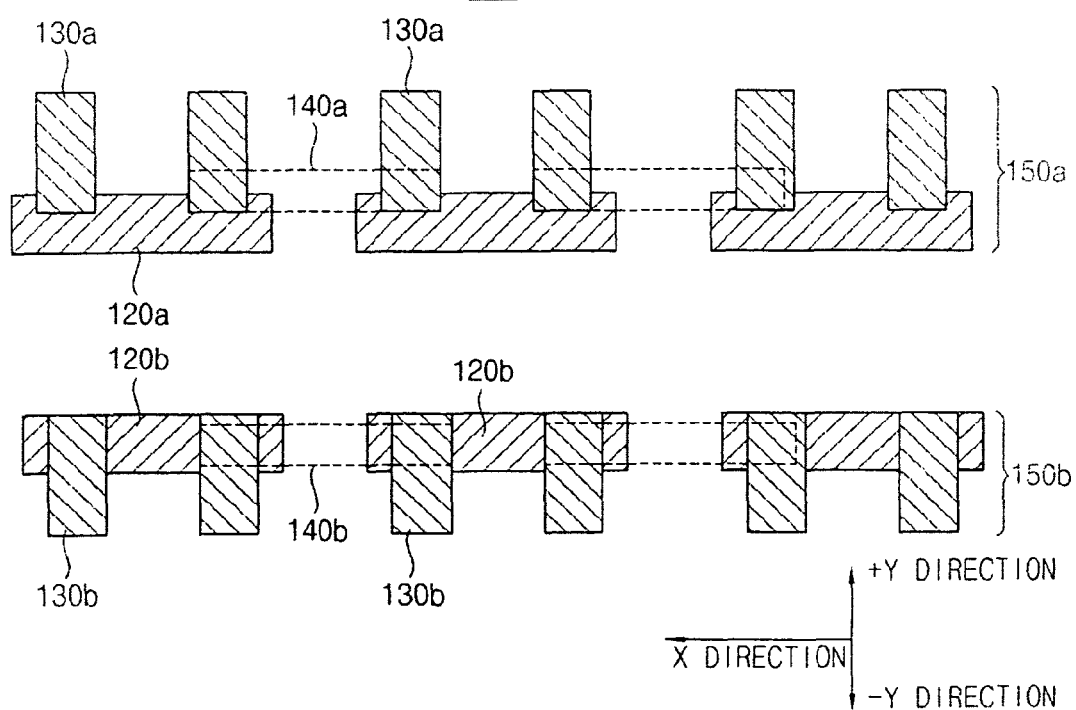

FIG. 1 is a top view illustrating a structure for measuring misalignment of patterns in accordance with example embodiments. FIG. 2 is a top view illustrating the structure of FIG. 1 in a misaligned state in a y-direction.

Referring to FIG. 1, a structure 100 for measuring misalignment of patterns may include a first wiring 150a and a second wiring 150b. The first wiring 150a may include a first lower pattern 120a and a first upper pattern 130a. A first end portion of the first upper pattern 130a may contact the first lower pattern 120a. The first upper pattern 130a may extend in the y-direction, and the first end portion of the first upper pattern 130a that is relatively further toward (proximal to) a negative y-direction may contact the first lower pattern 120a.

The first wiring 150a may include a plurality of first lower patterns 120a and a plurality of first upper patterns 130a, which are disposed in an x-direction. The first lower patterns 120a may be electrically connected to each other. For example, the first wiring 150a may include a first upper wiring 140a electrically connected to the first upper patterns 130a. As a result, the first lower patterns 120a may be electrically connected to each other through the first upper patterns 130a that are electrically connected to each other through the first upper wiring 140a. The first lower pattern 120a may include an impurity region of a memory cell, a word line, a contact plug, a bit line, or other suitable structure. The first upper pattern 130a may include a conductive pattern on or over the first lower pattern 120a.

The second wiring 150b may be spaced apart from the first wiring 150a, e.g., along the negative y-direction. The second wiring 150b may include a second lower pattern 120b and a second upper pattern 130b. A second end portion of the second upper pattern 130b may contact the second lower pattern 120b. The second upper pattern 130b may extend in the y-direction, and the second end portion of the second upper pattern 130b that is relatively further toward (proximal to) a positive y-direction may contact the second lower pattern 120b.

The second wiring 150b may include a plurality of second lower patterns 120b and a plurality of second upper patterns 130b, which are disposed in the x-direction. The second lower patterns 120b may be electrically connected to each other. For example, the second wiring 150b may include a second upper wiring 140b electrically connected to the second upper patterns 130b. Thus, the second lower patterns 120b may be electrically connected to each other through the second upper patterns 130b that are electrically connected to each other through the second upper wiring 140b. The second lower pattern 120b may include an impurity region of a memory cell, a word line, a contact plug, a bit line, or other suitable structure. The second upper pattern 130b may include a conductive pattern on or over the second lower pattern 120b.

The structure 100 may be formed on a substrate (not shown) including a cell region and a scribe lane region. For example, the structure 100 may be formed on the substrate in the scribe lane region. The structure 100 may be formed on the substrate in the scribe lane region when patterns of semiconductor devices are formed on the substrate in the cell region. The lower patterns 120a and 120b may be formed simultaneously when lower patterns of the semiconductor devices are formed, and the upper patterns 130a and 130b may be formed simultaneously when upper patterns of the semiconductor devices are formed.

Referring to FIG. 2, the upper patterns 130a and 130b may be misaligned along the positive y-direction. Thus, a first contact area between the first lower pattern 120a and the first upper pattern 130a may be decreased, and a second contact area between the second lower pattern 120b and the second upper pattern 130b may be increased.

When the first contact area decreases, a resistance of the first wiring 150a may be increased. Thus, the increase of the resistance of the first wiring 150a may indicate that a misalignment has occurred in the first wiring 150a. For example, the increase of the resistance of the first wiring 150a may mean that the first upper pattern 130a is offset along the positive y-direction. When the second contact area increases, a resistance of the second wiring 150b may be decreased. Thus, the decrease of the resistance of the second wiring 150b may also indicate that a misalignment has occurred in the second wiring 150b. For example, the decrease of the resistance of the second wiring 150b may mean that the second upper pattern 130b is offset along the positive y-direction.

The structure 100 for measuring misalignment of patterns may include the first and second wirings 150a and 150b that are not electrically connected to each other and that include the first and second upper patterns 130a and 130b, respectively. The first and second upper patterns 130a and 130b may contact the first and second lower patterns 120a and 120b, respectively, at different positions. Thus, the misalignment between the upper patterns 130a and 130b and the lower patterns 120a and 120b may be detected with relative accuracy.

Figure 3:
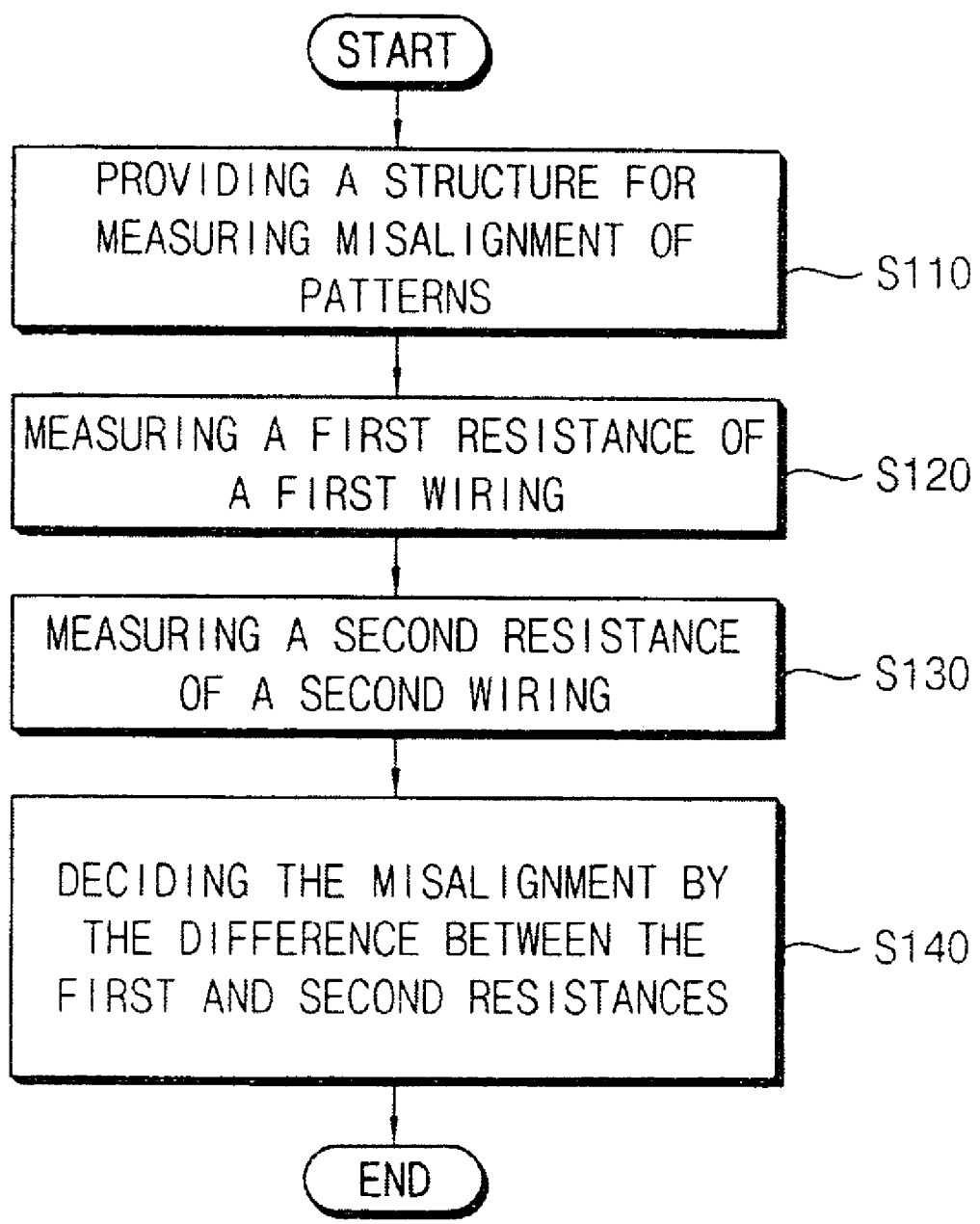

FIG. 3 is a flowchart illustrating a method of measuring misalignment of patterns using the structure 100 in FIGS. 1-2 in accordance with example embodiments. Referring to FIG. 3, in step S110, the structure 100 for measuring misalignment of patterns including the first wiring 150a and the second wiring 150b may be provided. The structure 100 may be formed on a substrate in a scribe lane region. For example, the lower patterns 120a may be formed on the substrate in the scribe lane region simultaneously when other lower patterns are formed on the substrate in a cell region, and the upper patterns 130a may be formed on the substrate in the scribe lane region simultaneously when other upper patterns are formed on the substrate in the cell region.

In step S120, a first resistance of the first wiring 150a may be measured. A first voltage may be applied to the first wiring 150a, and a first current flowing through the first wiring 150a may be measured. For example, when a first voltage of 3V is applied to the first wiring 150a and a first current of 1.5 A is measured, the first resistance of the first wiring 150a may be calculated as 2Ω.

In step S130, a second resistance of the second wiring 150b may be measured. A second voltage may be applied to the second wiring 150b, and a second current flowing through the second wiring 150b may be measured. For example, when a second voltage of 3V is applied to the second wiring 150b and a second current of 1 A is measured, the second resistance of the second wiring 150b may be calculated as 3Ω.

In step S140, the misalignment between the upper patterns 130a and 130b and the lower patterns 120a and 120b may be decided by the difference between the first and second resistances. If the resistance difference is zero, then a misalignment may not have occurred. On the other hand, if the resistance difference is greater or less than zero, then a misalignment may have occurred. For example, if the first resistance is larger than the second resistance, then the first upper pattern 130a may have shifted along the positive y-direction from the normal position, thereby reducing the first contact area, and/or the second upper pattern 130b may have shifted along the positive y-direction from the normal position, thereby increasing the second contact area. If the first resistance is smaller than the second resistance, then the first upper pattern 130a may have shifted along the negative y-direction from the normal position, thereby increasing the first contact area, and/or the second upper pattern 130b may have shifted along the negative y-direction from the normal position, thereby reducing the second contact area. By using the above method, a misalignment of the lower and upper patterns along a specific direction may be measured with relative accuracy.

Figure 4:
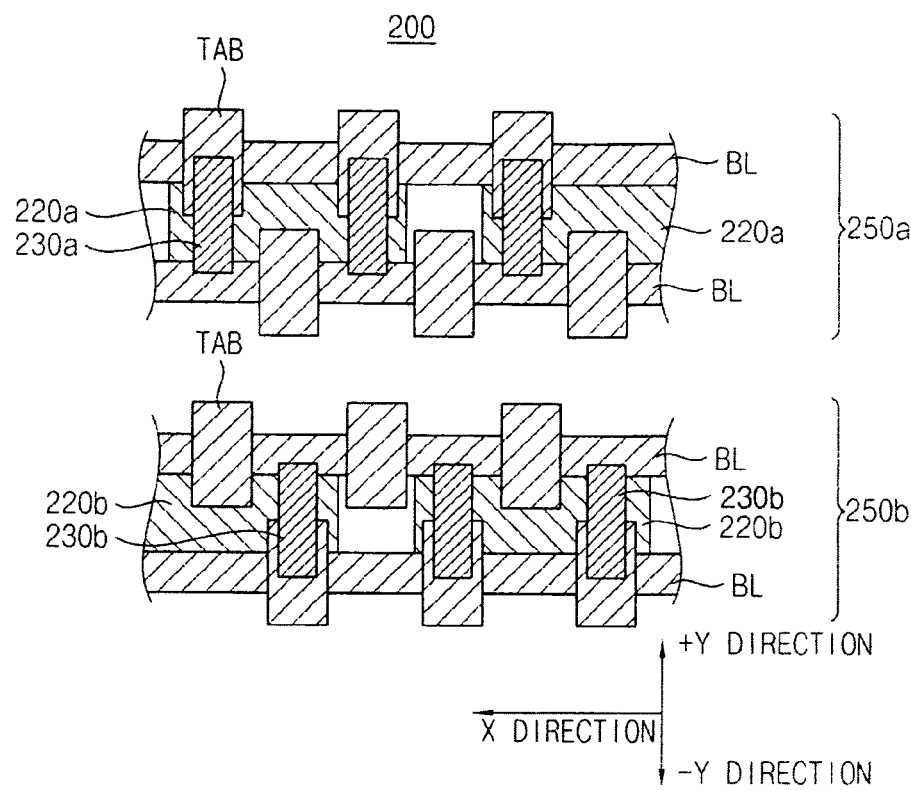
Figure 5:
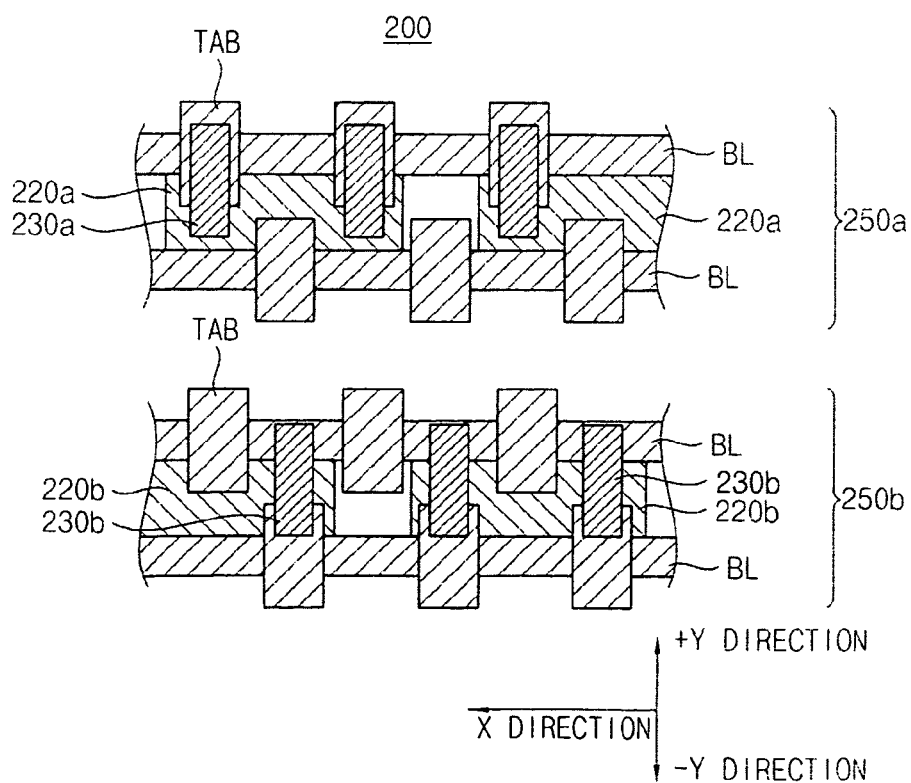

FIG. 4 is a top view illustrating another structure for measuring misalignment of patterns in accordance with example embodiments. FIG. 5 is a top view illustrating the structure of FIG. 4 in a misaligned state along a y-direction.

Referring to FIG. 4, a structure 200 for measuring misalignment of patterns may include a first wiring 250a and a second wiring 250b. The first wiring 250a may include a first lower pattern 220a and a first upper pattern 230a. The first upper pattern 230a may contact the first lower pattern 220a. The first wiring 250a may be disposed between two parallel bit lines BL extending in an x-direction perpendicular to the y-direction. A bit line tab TAB may be formed on each bit line BL. The first upper pattern 230a may partially overlap the bit line tab TAB. For example, the first upper pattern 230a may extend in the y-direction, and a first end portion of the first upper pattern 230a that is relatively further toward (proximal to) a positive y-direction may overlap the bit line tab TAB.

The first wiring 250a may include a plurality of first lower patterns 220a, a plurality of first upper patterns 230a, and a plurality of bit line tabs TAB, which are disposed in the x-direction. The first lower patterns 220a may be first self-aligned contact (SAC) plugs of a semiconductor device and may be electrically connected to each other by the first upper patterns 230a contacting wirings (not shown), e.g., storage node electrodes of capacitors. The first upper patterns 230a may be first capacitor contact plugs.

The second wiring 250b may be spaced apart from the first wiring 250a, e.g., along a negative y-direction. The second wiring 250b may include a second lower pattern 220b and a second upper pattern 230b. The second upper pattern 230b may contact the second lower pattern 220b. The second wiring 250b may be disposed between a pair of bit lines BL, and a bit line tab TAB may be formed on each bit line BL. The second upper pattern 230b may partially overlap the bit line tab TAB. For example, the second upper pattern 230b may extend in the y-direction, and a second end portion of the second upper pattern 230b that is relatively further toward (proximal to) the negative y-direction may overlap the bit line tab TAB.

The second wiring 250b may include a plurality of second lower patterns 220b, a plurality of second upper patterns 230b, and a plurality of bit line tabs TAB, which are disposed in the x-direction. The second lower patterns 220b may be second self-aligned contact (SAC) plugs of the semiconductor device and may be electrically connected to each other by the second upper patterns 230b contacting wirings (not shown), e.g., storage node electrodes of capacitors. The second upper patterns 230b may be second capacitor contact plugs.

The structure 200 may be formed on a substrate (not shown) including a cell region and a scribe lane region. For example, the structure 200 may be formed on the substrate in the scribe lane region. The structure 200 may be formed on the substrate in the scribe lane region when patterns of semiconductor devices are formed on the substrate in the cell region. The lower patterns 220a and 220b may be formed simultaneously when lower patterns (e.g., SAC plugs) of the semiconductor devices are formed, and the upper patterns 230a and 230b may be formed simultaneously when upper patterns (e.g., capacitor contact plugs) of the semiconductor devices are formed.

Referring to FIG. 5, the upper patterns 230a and 230b may be misaligned along the positive y-direction. Thus, a first contact area between the first lower pattern 220a and the first upper pattern 230a may be decreased because of the increase of the overlap between the first upper pattern 230a and the bit line tab TAB. However, a second contact area between the second lower pattern 220b and the second upper pattern 230b may not change.

When the first contact area decreases, a resistance of the first wiring 250a may be increased. Thus, the increase of the resistance of the first wiring 250a may indicate that a misalignment has occurred in the first wiring 250a. For example, the increase of the resistance of the first wiring 250a may mean that the first upper pattern 230a is offset along the positive y-direction.

The structure 200 for measuring misalignment of patterns may include the first and second wiring 250a and 250b that are not electrically connected to each other and include the first and second upper patterns 230a and 230b, respectively. The first and second upper patterns 230a and 230b may contact the first and second lower patterns 220a and 220b, respectively, at different positions. Thus, a misalignment between the upper patterns 230a and 230b and the lower patterns 220a and 220b may be detected with relative accuracy.

A method of measuring misalignment of patterns using the structure 200 in FIGS. 4-5 may be explained as follows. As shown in FIG. 4, the structure 200 for measuring misalignment of patterns including the first wiring 250a and the second wiring 250b may be provided. The structure 200 may be formed on a substrate in a scribe lane region. For example, the lower patterns 220a may be formed on the substrate in the scribe lane region simultaneously when other lower patterns (e.g., SAC plugs) are formed on the substrate in a cell region, and the upper patterns 230a may be formed on the substrate in the scribe lane region simultaneously when other upper patterns (e.g., capacitor contact plugs) are formed on the substrate in the cell region.

A first resistance of the first wiring 250a may be measured. For example, a first voltage may be applied to the first wiring 250a including the first lower patterns 220a and the first upper patterns 230a, and a first current flowing through the first wiring 250a may be measured. A second resistance of the second wiring 250b may be measured. For example, a second voltage may be applied to the second wiring 250b including the second lower patterns 220b and the second upper patterns 230b, and a second current flowing through the second wiring 250b may be measured.

A misalignment between the upper patterns 230a and 230b and the lower patterns 220a and 220b may be decided by the difference between the first and second resistances. If the resistance difference is zero, then a misalignment may not have occurred. On the other hand, if the resistance difference is greater or less than zero, then a misalignment may have occurred. For example, if the first resistance is larger than the second resistance, then the first upper pattern 230a may have shifted along the positive y-direction from the normal position, thereby reducing the first contact area. If the second resistance is larger than the first resistance, then the second upper pattern 230b may have shifted along the negative y-direction from the normal position, thereby reducing the second contact area. By using the above method, a misalignment of the lower and upper patterns along a specific direction may be measured with relative accuracy.

Figure 6:
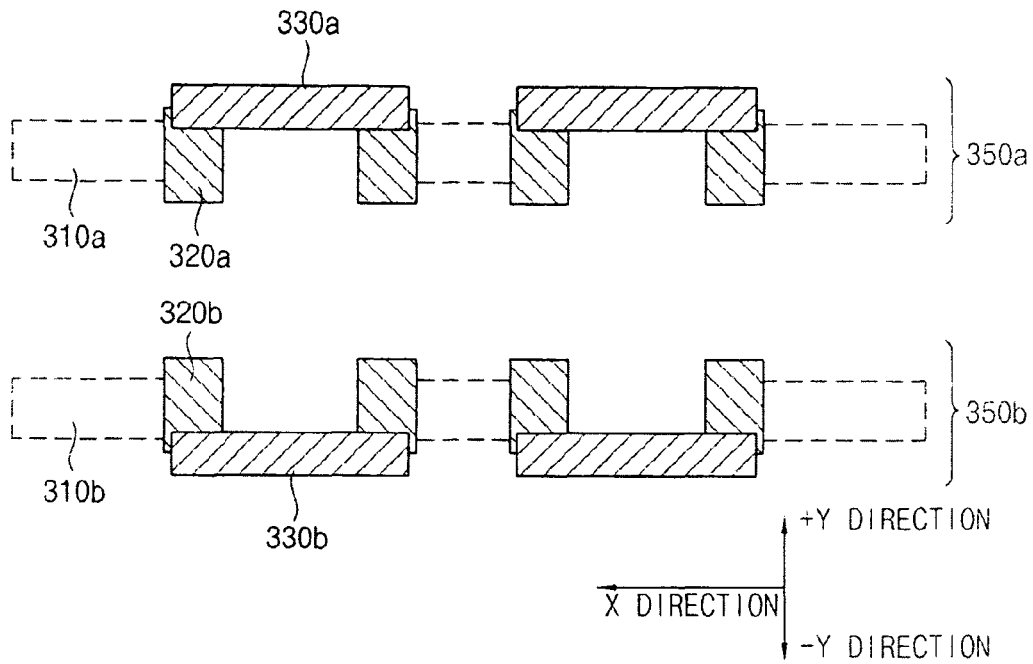
Figure 7:
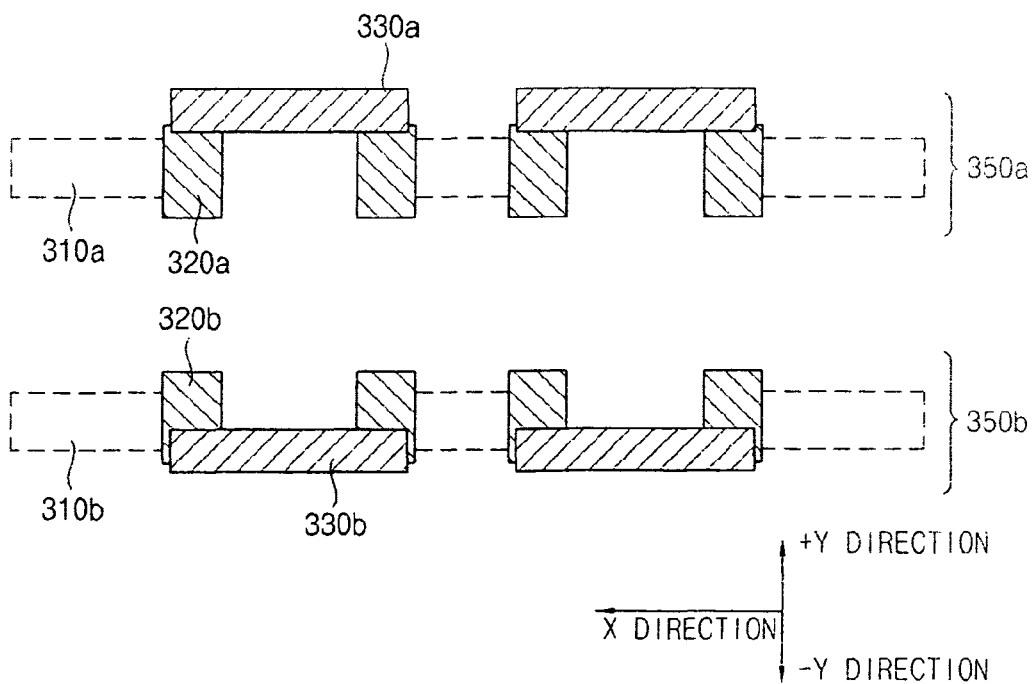

FIG. 6 is a top view illustrating another structure for measuring misalignment of patterns in accordance with example embodiments. FIG. 7 is a top view illustrating the structure of FIG. 6 in a misaligned state in a y-direction.

Referring to FIG. 6, a structure 300 for measuring misalignment of patterns may include a first wiring 350a and a second wiring 350b. The first wiring 350a may include a first lower pattern 320a and a first upper pattern 330a. The first upper pattern 330a may contact the first lower pattern 320a. The first wiring 350a may be disposed between a pair of bit lines (not shown), and a bit line tab (not shown) may be formed on each bit line. The first lower pattern 320a may partially overlap the bit line tab. For example, the first lower pattern 320a may extend in the y-direction, and a first end portion of the first lower pattern 320a that is relatively further toward (proximal to) a positive y-direction may contact the first upper pattern 330a.

The first wiring 350a may include a plurality of first lower patterns 320a and a plurality of first upper patterns 330a, which are disposed in an x-direction. The first lower patterns 320a may be first capacitor contact plugs of a semiconductor device and may be electrically connected to each other by the first upper patterns 330a, e.g., storage node electrodes of capacitors. The first lower patterns 320a may be electrically connected to first SAC plugs 310a.

The second wiring 350b may be spaced apart from the first wiring 350a, e.g., along a negative y-direction. The second wiring 350b may include a second lower pattern 320b and a second upper pattern 330b. The second upper pattern 330b may contact the second lower pattern 320b. The second wiring 350b may be disposed between a pair of bit lines (not shown), and a bit line tab (not shown) may be formed on each bit line. The second lower pattern 320b may partially overlap the bit line tab. For example, the second lower pattern 320b may extend in the y-direction, and a second end portion of the second lower pattern 320b that is relatively further toward (proximal to) the negative y-direction may contact the second upper pattern 330b.

The second wiring 350b may include a plurality of second lower patterns 320b and a plurality of second upper patterns 330b, which are disposed in the x-direction. The second lower patterns 320b may be second capacitor contact plugs of the semiconductor device and may be electrically connected to each other by the second upper patterns 330b, e.g., storage node electrodes of capacitors. The second lower patterns 320b may be electrically connected to second SAC plugs 310b.

The structure 300 may be formed on a substrate (not shown) including a cell region and a scribe lane region. For example, the structure 300 may be formed on the substrate in the scribe lane region. The structure 300 may be formed on the substrate in the scribe lane region when patterns of semiconductor devices are formed on the substrate in the cell region. The lower patterns 320a and 320b may be formed simultaneously when lower patterns (e.g., capacitor contact plugs) of the semiconductor devices are formed, and the upper patterns 330a and 330b may be formed simultaneously when upper patterns (e.g., storage node electrodes) of the semiconductor devices are formed.

Referring to FIG. 7, the upper patterns 330a and 330b may be misaligned along the positive y-direction. Thus, a first contact area between the first lower pattern 320a and the first upper pattern 330a may be decreased, and a second contact area between the second lower pattern 320b and the second upper pattern 330b may be increased.

When the first contact area decreases, a resistance of the first wiring 350a may be increased. Thus, the increase of the resistance of the first wiring 350a may indicate that a misalignment has occurred in the first wiring 350a. For example, the increase of the resistance of the first wiring 350a may mean that the first upper pattern 330a is offset along the positive y-direction. When the second contact area increases, a resistance of the second wiring 350b may be decreased. Thus, the decrease of the resistance of the second wiring 350b may also indicate that a misalignment has occurred in the second wiring 350b. For example, the decrease of the resistance of the second wiring 350b may mean that the second upper pattern 330b is offset along the positive y-direction.

The structure 300 for measuring misalignment of patterns may include the first and second wirings 350a and 350b that are not electrically connected to each other and include the first and second upper patterns 330a and 330b, respectively. The first and second upper patterns 330a and 330b may contact the first and second lower patterns 320a and 320b, respectively, at different positions. Thus, the misalignment between the upper patterns 330a and 330b and the lower patterns 320a and 320b may be detected with relative accuracy.

A method of measuring misalignment of patterns using the structure 300 in FIGS. 6-7 may be explained as follows. As illustrated in FIG. 6, the structure 300 for measuring misalignment of patterns including the first wiring 350a and the second wiring 350b may be provided. The structure 300 may be formed on a substrate in a scribe lane region. For example, the lower patterns 320a may be formed on the substrate in the scribe lane region simultaneously when other lower patterns (e.g., capacitor contact plugs) are formed on the substrate in a cell region, and the upper patterns 330a may be formed on the substrate in the scribe lane region simultaneously when other upper patterns (e.g., storage node electrodes of capacitors) are formed on the substrate in the cell region.

A first resistance of the first wiring 350a may be measured. For example, a first voltage may be applied to the first wiring 350a including the first lower patterns 320a and the first upper patterns 330a, and a first current flowing through the first wiring 350a may be measured. A second resistance of the second wiring 350b may be measured. For example, a second voltage may be applied to the second wiring 350b including the second lower patterns 320b and the second upper patterns 330b, and a second current flowing through the second wiring 350b may be measured.

A misalignment between the upper patterns 330a and 330b and the lower patterns 320a and 320b may be decided by the difference between the first and second resistances. If the resistance difference is zero, then a misalignment may not have occurred. On the other hand, if the resistance difference is greater or less than zero, then a misalignment may have occurred. For example, if the first resistance is larger than the second resistance, then the first upper pattern 330a may have shifted along the positive y-direction from the normal position, thereby reducing the first contact area, and/or the second upper pattern 330b may have shifted along the positive y-direction from the normal position, thereby increasing the second contact area. If the first resistance is smaller than the second resistance, then the first upper pattern 330a may have shifted along the negative y-direction from the normal position, thereby increasing the first contact area, and/or the second upper pattern 330b may have shifted along the negative y-direction from the normal position, thereby reducing the second contact area. By using the above method, a misalignment of the lower and upper patterns along a specific direction may be measured with relative accuracy.

According to example embodiments, a structure for measuring misalignment of patterns may include at least two wirings, which are electrically insulated from each other and include upper and lower patterns. As a result, a misalignment between the upper and lower patterns along a specific direction may be measured with greater accuracy.

The foregoing is illustrative of example embodiments and is not to be construed as limiting thereof. Although various examples have been described, those skilled in the art will readily appreciate that many modifications are possible without materially departing from the novel teachings and advantages of the present inventive concept. Accordingly, all such modifications are intended to be included within the scope of the present inventive concept as defined in the claims. In the claims, means-plus-function clauses (if applicable) are intended to cover the structures described herein as performing the recited function and not only structural equivalents but also equivalent structures. Therefore, it is to be understood that the foregoing is illustrative of example embodiments and is not to be construed as limited to the specific examples disclosed. As a result, other suitable modifications to the disclosed examples are intended to be included within the scope of the appended claims.

What is claimed is:

1. A structure for measuring misalignment of patterns, comprising:
   a first wiring including a first lower pattern and a first upper pattern, the first upper pattern extending in a y-direction, a first end portion of the first upper pattern that is proximal to a negative y-direction contacting the first lower pattern; and
   a second wiring including a second lower pattern and a second upper pattern, the second upper pattern extending in the y-direction, a second end portion of the second upper pattern that is proximal to a positive y-direction contacting the second lower pattern, and the second wiring being spaced apart from the first wiring in the negative y-direction,
   wherein the first wiring and the second wiring are not electrically connected to each other.

2. The structure of claim 1, wherein
   the first wiring has a first resistance which changes according to a first misalignment between the first upper pattern and the first lower pattern in the y-direction, and
   the second wiring has a second resistance which changes according to a second misalignment between the second upper pattern and the second lower pattern in the y-direction.

3. The structure of claim 2, wherein the first resistance increases when the second resistance decreases.

4. The structure of claim 1, wherein the first upper pattern has a shape identical to that of the second upper pattern.

5. The structure of claim 1, wherein the first upper pattern is linear in form.

6. The structure of claim 5, wherein the first upper pattern has a longitudinal axis aligned with that of the second upper pattern.

7. The structure of claim 1, wherein the first upper pattern includes two individual patterns contacting the first lower pattern.

8. The structure of claim 7, wherein the two individual patterns of the first upper pattern are arranged in parallel.

* * * * *